United States Patent
Pan et al.

(10) Patent No.: US 6,791,095 B2
(45) Date of Patent: Sep. 14, 2004

(54) METHOD AND SYSTEM OF USING A SCANNING ELECTRON MICROSCOPE IN SEMICONDUCTOR WAFER INSPECTION WITH Z-STAGE FOCUS

(75) Inventors: Chung-Shih Pan, Palo Alto, CA (US); Yi Xiang Wang, Fremont, CA (US); Anil Desai, San Jose, CA (US)

(73) Assignee: Hermes-Microvision (Taiwan) Inc., Hsinchu (TW)

( * ) Notice: Subject to any disclaimer, the term of this patent is extended or adjusted under 35 U.S.C. 154(b) by 0 days.

(21) Appl. No.: 10/104,887

(22) Filed: Mar. 21, 2002

(65) Prior Publication Data

US 2003/0178576 A1 Sep. 25, 2003

(51) Int. Cl.[7] ................................................. H01J 37/20
(52) U.S. Cl. ................................................. 250/442.11
(58) Field of Search ........................... 250/442.11, 311

(56) References Cited

U.S. PATENT DOCUMENTS

| | | | |
|---|---|---|---|
| 5,216,235 A | 6/1993 | Lin | 250/201.6 |
| 5,494,838 A | 2/1996 | Chang et al. | 437/43 |
| 5,858,587 A | 1/1999 | Yamane et al. | 430/22 |
| 6,124,601 A | 9/2000 | Yoshii et al. | 250/559.29 |
| 6,136,717 A | 10/2000 | Winnerl et al. | 438/705 |
| 6,259,093 B1 | 7/2001 | Wakiyama et al. | 250/306 |
| 6,407,373 B1 * | 6/2002 | Dotan | 250/201.3 |
| 6,538,248 B1 * | 3/2003 | Kametani et al. | 250/310 |
| 2003/0071981 A1 * | 4/2003 | Ueta | 355/72 |

* cited by examiner

*Primary Examiner*—John R. Lee
*Assistant Examiner*—Phillip A Johnston
(74) *Attorney, Agent, or Firm*—Townsend and Townsend and Crew LLP

(57) ABSTRACT

A method for inspecting a semiconductor wafer using an SEM having a nominal focal plane and operable for guiding a beam. The SEM having a stage movable in each of an X-, Y-, and Z-direction, including moving the SEM stage in the XY-direction to a first location for inspection, optically sensing the location of the top surface of an area in relation to the focal plane of the stage, adjusting the position of the stage in the Z-direction so that the top surface of the area is substantially at the focal plane, inspecting the areas, and moving the stage in the XY-direction to the next location such that the next area is under the SEM beam for inspection. The Z-stage using a non-contact optical sensor to provide feedback to drive a plurality of piezoelectric actuator to move the wafer to the focal plane.

23 Claims, 6 Drawing Sheets

METHOD AND SYSTEM OF USING A SCANNING ELECTRON MICROSCOPE IN SEMICONDUCTOR WAFER INSPECTION WITH Z-STAGE FOCUS

BRIEF DESCRIPTION OF THE INVENTION

1. Field of the Invention

The present invention relates generally to wafer inspection and more particularly to a system and method for automatically moving a wafer within the focus of a scanning electron microscope used in semiconductor wafer inspection.

2. Background of the Invention

Improvements in the semiconductor manufacturing technology have allowed for designing and manufacturing of higher density Very Large Scale Integrated (VLSI) circuits and packing more transistors on a given surface area to form a semiconductor device or chip. Increasing transistor density on a given chip has led to the need for method to provide electrically related, higher resolution wafer inspection. In semiconductor device manufacturing processes, defects may be unintentionally generated during the various stages of semiconductor processing. Thus, it is important to find defects accurately and efficiently as early as possible.

Generally, a process for manufacturing semiconductor devices comprises the operation of forming layers of a variety of material on or in the substrate of each semiconductor device; photo-processing, masking and printing circuit patterns on the semiconductor device; and removing or etching portions of the layers to form the semiconductor device. Such semiconductor devices are manufactured by repeating these and other operations on each device of a semiconductor wafer. Better manufacturing techniques have allowed for micro fabrication, resulting in features that are less than $0.1 \mu m$. Inspections of the wafer are made to check for obtaining defect free devices.

Conventional wafer inspection methods consist of a high magnification and high resolution imaging system, where the photomask is scanned pixel by pixel by a laser diode. Other wafer inspection methods call for the use of optical microscopes in the wafer inspection. Scanning Electron Microscopes (SEM) have been used in some defect detection methods such as critical dimension measurement. With the increasing numbers of transistors packed on a chip, more efficient and more accurate wafer inspection detection method is desired.

Therefore, it is desirable to provide a method and system capable of providing a new means for wafer inspection, better suited for the emerging super higher density semiconductors.

SUMMARY OF THE INVENTION

It is an object of the present invention to provide an SEM system and method for positioning a specimen to the focal point of an SEM for inspecting defects in the specimen.

An SEM lens design result in an ideal theoretical focal plane, at which point peak performance of wafer inspection may be achieved. It is therefore yet another object of the present invention to provide an improved SEM apparatus and method for achieving a higher degree of wafer inspection performance by bringing the wafer under inspection into the ideal focal plane, rather than adjusting the focal point of the SEM. In one embodiment, the present Z-stage can move the wafer precisely to the plan within 0.25 micron range of the ideal focal plane.

Briefly, one embodiment of the present invention includes a method of positioning a specimen situated in a scanning electron microscope environment for inspecting defects in a plurality of areas of said specimen, the scanning electron microscope providing a particle beam along an axis perpendicular to the specimen. The method including moving said specimen in directions perpendicular to said particle beam axis to a first of said plurality of areas; sensing and moving the specimen toward a focal plane of the particle beam in a direction along the particle beam axis; suspending moving the specimen when the specimen is positioned within the focal plane proximity and the proximity of said first of said plurality of areas; scanning and inspecting the first of said plurality of areas for defects; and moving said specimen from the first inspection area to a second of said plurality of areas for inspection.

Yet another aspect of the present invention is embodied in a system of positioning a specimen situated in a scanning electron microscope environment for inspecting defects in a plurality of areas of said specimen, the scanning electron microscope providing a particle beam along an axis perpendicular to the specimen. The system including means for moving said specimen in directions perpendicular to said particle beam axis to a first of said plurality of areas; means for sensing and moving the specimen toward a focal plane of the particle beam in a direction along the particle beam axis; means for suspending moving the specimen when the specimen is positioned within the focal plane proximity and the proximity of said first of said plurality of areas; means for scanning and inspecting the first of said plurality of areas for defects; and means for moving said specimen from said first inspection area to a second of said plurality of areas for inspection.

One advantage of the present invention is that it provides an improved SEM focusing method and system used for defect detection in semiconductor wafer inspection systems.

These and other objects and advantages of the present invention will no doubt become apparent to those skill in the art after having read the following detailed description of preferred embodiments which are illustrated in the several figures of the drawing.

DETAILED DESCRIPTION OF THE INVENTION

Generally, scanning electron microscopes comprise an electron gun generating an electron beam used for scanning.

The electron beam is guided inside a vacuum chamber through a set of condensing lenses, scanning coils and objective lenses before reaching the device under examination. The SEM device of the present invention is used to inspect the surface of a semiconductor wafer or mask for defects. Therefore, the target of the beam is the wafer under inspection and it needs to be placed at the optimum focal point of the SEM before the surface scanning may commence.

The method of the present invention applies to Scanning Electron Microscope (SEM), which typically includes a source for generating a primary electron beam, a plurality of deflection units that enable the positioning and scanning movement of the primary beam over onto a specimen, and a detection system for capturing secondary electrons or backscattered electrons from the specimen to produce an image of the specimen for inspecting very small structures of a specimen in great detail. The invention involves using an automated Z-stage adjustment mechanism in a scanning electron microscope and allowing for an efficient and accurate wafer inspection to be conducted. Since defects introduced into the chips are random in nature, defects introduced at various stages of the manufacturing process might result in differences between various areas of a wafer, however, ideally they would be identical if without defects. Thus, wafer inspection techniques generally involve comparing two or more locations on a wafer to each other or to an ideal model. If the manufacturing operation generates flawless results, the features of the two location would be substantially identical and a comparison would result in a similar result or a perfect match. Thus, the goal of the wafer inspection of the present invention is to detect critical defects created during the manufacturing process that would result in chip failure.

Figure 1:
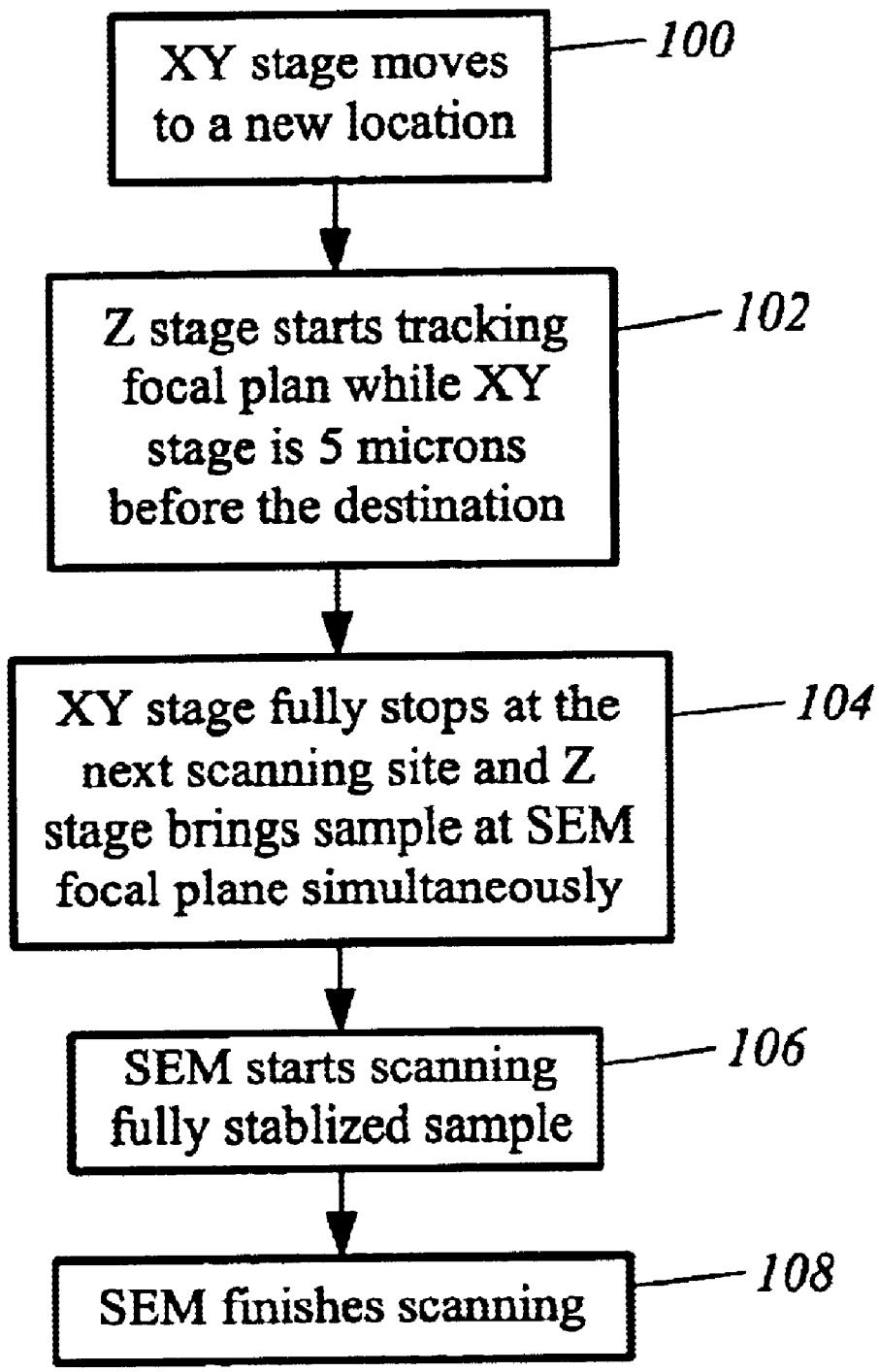
FIG. 1 is a flow diagram illustrating an SEM inspection process according to one embodiment of the present invention.

FIG. 1 is a flow diagram illustrating an SEM inspection process according to one exemplary embodiment of the present invention. In the process, an SEM stage is capable of moving in three dimensions, along the X-, Y- and Z-directions. The movements in the X- and Y-direction (referred to herein as XY-stage) position the area of the wafer to be inspected under the SEM beam. The movement in the Z-direction (referred to herein as the Z-stage) brings the area of the wafer under inspection in SEM focus.

In an exemplary embodiment of the present invention, the inspection process begins with the XY-stage moving so that the next area of the wafer to be inspected is positioned under the SEM beam (step 100).

Next, the Z-stage starts tracking the vertical position of the area of the wafer to be inspected with respect to the SEM lens' nominal focal plane before the XY-stage has come to a full stop (step 102). In one embodiment, the Z-stage tracking starts once the XY-stage is approximately five (5) micrometer of its destination. This feature provides a more efficient automated focusing mechanism that stabilizes more quickly. The Z-stage tracking is performed by sensing the location of the top wafer surface of the area to be inspected in relation to the SEM nominal focal plane.

Next, the XY-stage comes to a full stop at its new location for the area on the wafer to be scanned, in the meantime the Z-stage brings the area under inspection to the nominal focal plane of the SEM (step 104). The Z-stage movements are based on the feedback signals received from an optical sensor measuring the distance of the top surface of the wafer area to be inspected in relation to the nominal focal plane. In an exemplary embodiment of the present invention, the sensor is calibrated based on the nominal focal plane of the SEM. Thus the optical sensor is capable of measuring any deviation of the height (Z-axis coordinate) of the top surface of the area of the wafer to be inspected from the height of the nominal focal point.

Next, after the Z-stage adjustments have been completed and the Z-stage has stabilized, the SEM starts scanning the wafer area (step 106).

Finally, the SEM completes the scanning and the inspection for the targeted wafer area, and the XY-stage moves to a new area to be scanned 100 as described above in step 100 (step 108).

Figure 2:
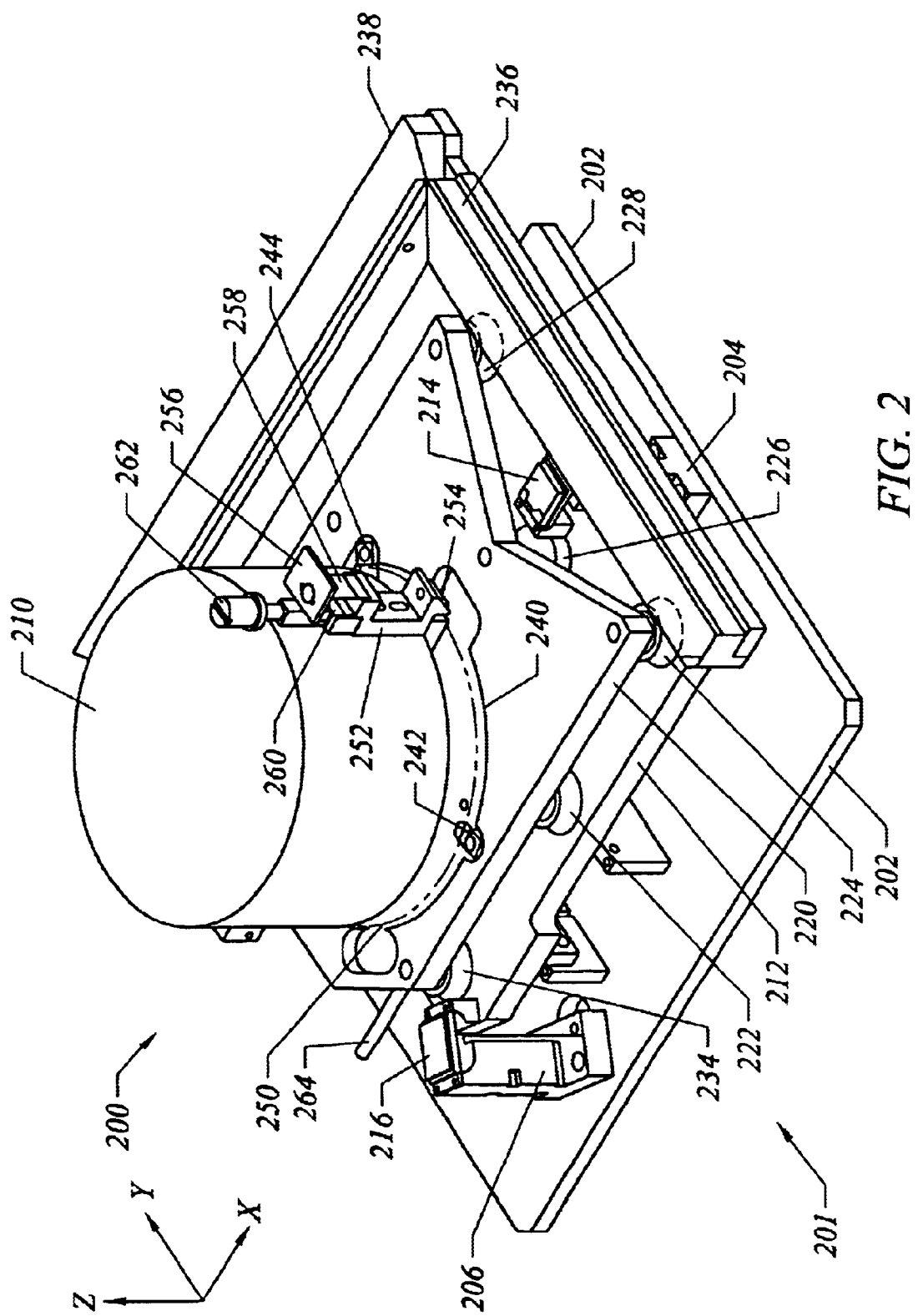
FIG. 2 is an illustration of a perspective view of a Z-stage SEM inspection device according to one embodiment of the present invention.

FIG. 2 is a drawing illustrating a perspective view of the Z-stage SEM inspection device 200 in accordance with one embodiment of the present invention. However, FIG. 2 does not show the entire SEM inspection device 200. The XYZ-stage assembly 201 is capable of moving a wafer under inspection along the X-, Y- and Z-axes to any X-, Y-, and Z-coordinates respectively within the range of motion allowed. As described and illustrated in this application, the Z-axis corresponds to an axis orthogonal (vertical direction) to a horizontal plane (the plane of the XY-stage) in which the wafer is situated. The XY-stage movements position the area of the wafer to be inspected under the electron beam of the SEM for inspection, and the Z-stage movements brings the surface of the wafer area to be inspected into the SEM focus.

In one embodiment, the Z-stage assembly 201 comprises of a base 202 upon which the Z-stage assembly 201 is situated. Positioned on the base plate 202 are three actuator columns 204, 206 and 208 (see FIG. 3). The three actuator columns are attached to and support a grounding plate 212. Each of the actuator columns 204, 206 and 208 is attached to the grounding plate 212 through a flexure mechanisms 214, 216 and 218 and include actuators operable to move in vertical direction, as further described in conjunction with FIG. 6. Piezoelectric actuators within each actuator column 204, 206, 208 and the attached flexure mechanisms 214, 216, 218 operate simultaneously to move the grounding plate 212 along the Z-axis, orthogonal to the plane of the wafer. The simultaneous operation of the three actuator columns maintain the wafer in a substantially horizontal plane at all times.

Mounted along the edge of the grounding plate 212 are two full length interferometer mirrors 236 and 238, one for the X-direction and one for the Y-direction. The interferometer mirrors 236 and 238 are used in measuring the movements of the wafer 250 in the X- and Y-directions. Laser beams bouncing off of each interferometer mirrors 236 and 238 are used to measure the exact movements of the wafer in both the X- and the Y-direction. In order to achieve the more accurate measurements, some designs have placed the interferometer mirrors on a top plate, also called a high voltage plate 220. In such a structure the interferometer mirrors is required to withstand the high potential of the high voltage plate 220. In one embodiment of the present invention, the interferometer mirrors 236 and 238 are located on the grounding plate, at approximately the wafer 250 height, allowing for the accurate measurement of the actual position of the wafer 250 with minimum offset error.

The top plate or high voltage plate 220 is situated above the grounding plate 212 and is electrically isolated from the grounding plate 212 by a plurality of ceramic insulators 222–234. The ceramic insulator 232 is completely hidden and the ceramic insulator 226–230 are partially hidden in this perspective view (FIG. 2) of the Z-stage SEM inspection device 200.

An electrostatic chuck 240 located in an indentation within the high voltage plate 220 is used to hold in place the wafer 250 under inspection. The electrostatic chuck 240 is in turn clamped by three clamps 242, 244 and 246. The electrostatic chuck uses electrical charges to hold the wafer 250 in place. However, the use of a ceramic (nonconductive) base electrostatic chuck to hold the wafer 250 helps minimize the generation of eddy currents that tend to generate because of the movements of the XY-stage.

An SEM lens 210 is situated above the wafer 250 under inspection and focuses the electron beam generated by an electron gun not shown in here. The SEM lens has a nominal focal plane. Bringing the sample under inspection to this nominal focal point would result in the closer to ideal operating conditions.

A photoelectric wafer height sensor (detector) assembly 252 is situated next to the SEM lens 210 and generates feedback signals as an indication to dictate the direction of the automated Z-stage movement in reference to the focal plane of the SEM lens 210. This photoelectric sensor assembly 252 controls the voltage applied to the piezoelectric mechanism. Voltages applied to the piezoelectric mechanism causes the piezoelectric mechanism to expand or contract. And, as a result of the expansion or contraction of the piezoelectric mechanism, the Z-stage moves up and down to adjust the height of the Z-stage. The operation of the photoelectric sensor assembly 252 is described in detail in FIG. 5. In this view of the photoelectric sensor assembly 252, a frame 253, a mirror 254, a pair of springs 258 and 260 supporting a photoelectric detector (sensor) 256 and an adjustment screw 262 are shown.

In an exemplary embodiment, a wafer lifter lever 264 may be used to sever the wafer from its location on the electrostatic chuck 240. The wafer lifting lever 264 is connected to a mechanism that lifts the wafer 250 under inspection from its position under the SEM lens 210 for replacement by another wafer.

Figure 3:
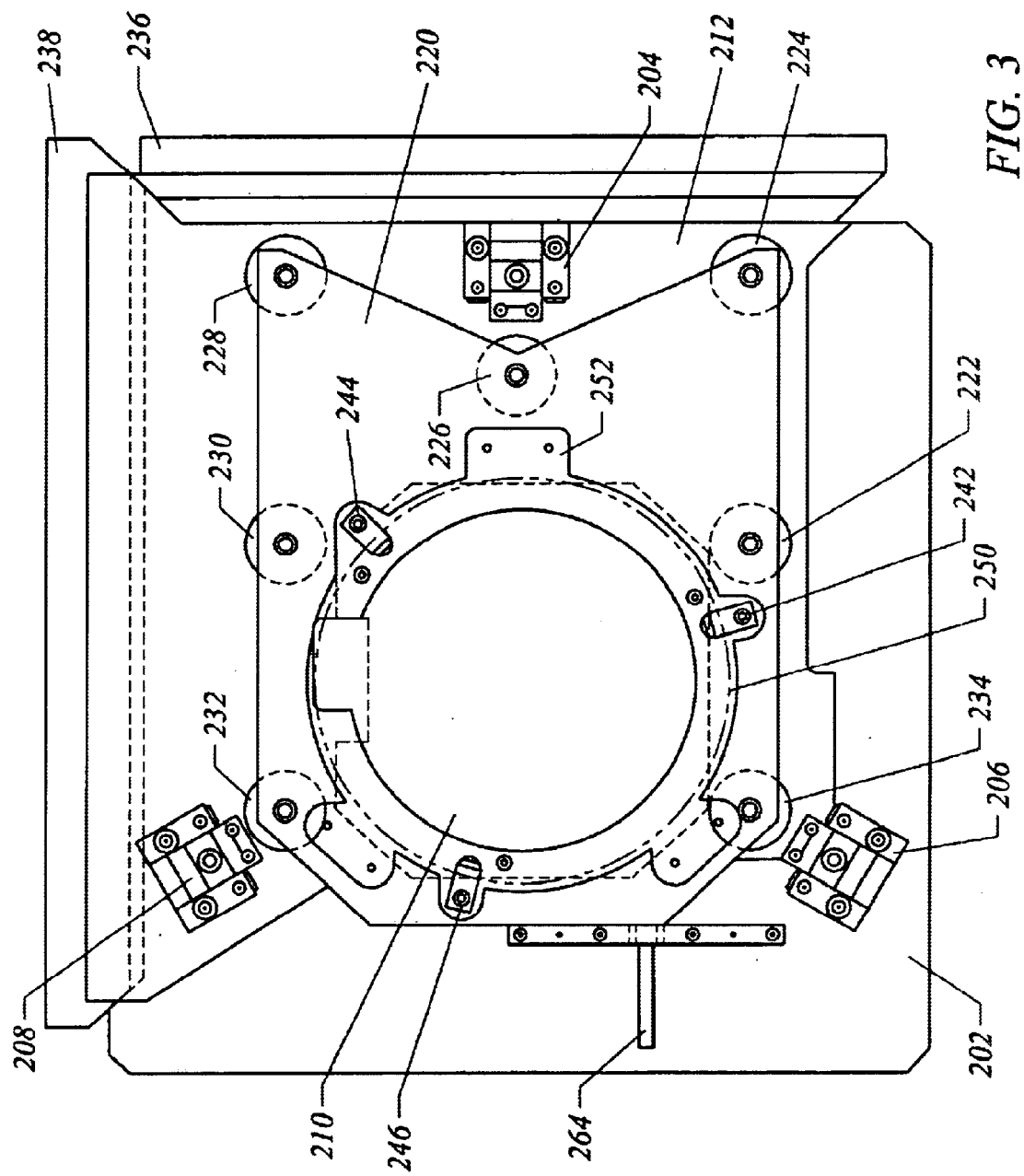
FIG. 3 is an illustration of the top view of the Z-stage inspection device according to one embodiment of the present invention.

FIG. 3 is a diagram depicting the top view of the SEM inspection apparatus 200 according to one embodiment of the present invention. The top view of the SEM inspection apparatus 200 includes the base plate 202, the three actuator columns 204–208, the grounding plate 212, the pair of full length interferometer mirrors 236 and 238 mounted along the edges of the grounding plate 212, the plurality of ceramic insulators 222–234, the high voltage plate 220, the plurality of clamps 242–246 holding the electrostatic chuck 240, the wafer lifting lever 264 and the SEM lens 210.

Each of the three actuator columns 204, 206, and 208 is attached to the upper surface of the base plate 202 and supports the grounding plate 212 through a flexure mechanism (214, 216, 218).

The plurality of ceramic insulators (seven in this embodiment) 222–234 are attached to the upper surface of the grounding plate 212 and physically support and electrically isolate the high voltage plate 220. The wafer under inspection 250 may be held at the same voltage as the high voltage plate 220, while a polar electrical charge generated at the surface of the electrostatic chuck holds the wafer 250 in place. Once the electrostatic chuck is charged, it holds the charge and no current flows to it. The wafer 250 is shown in this view with the doted line.

Figure 4:
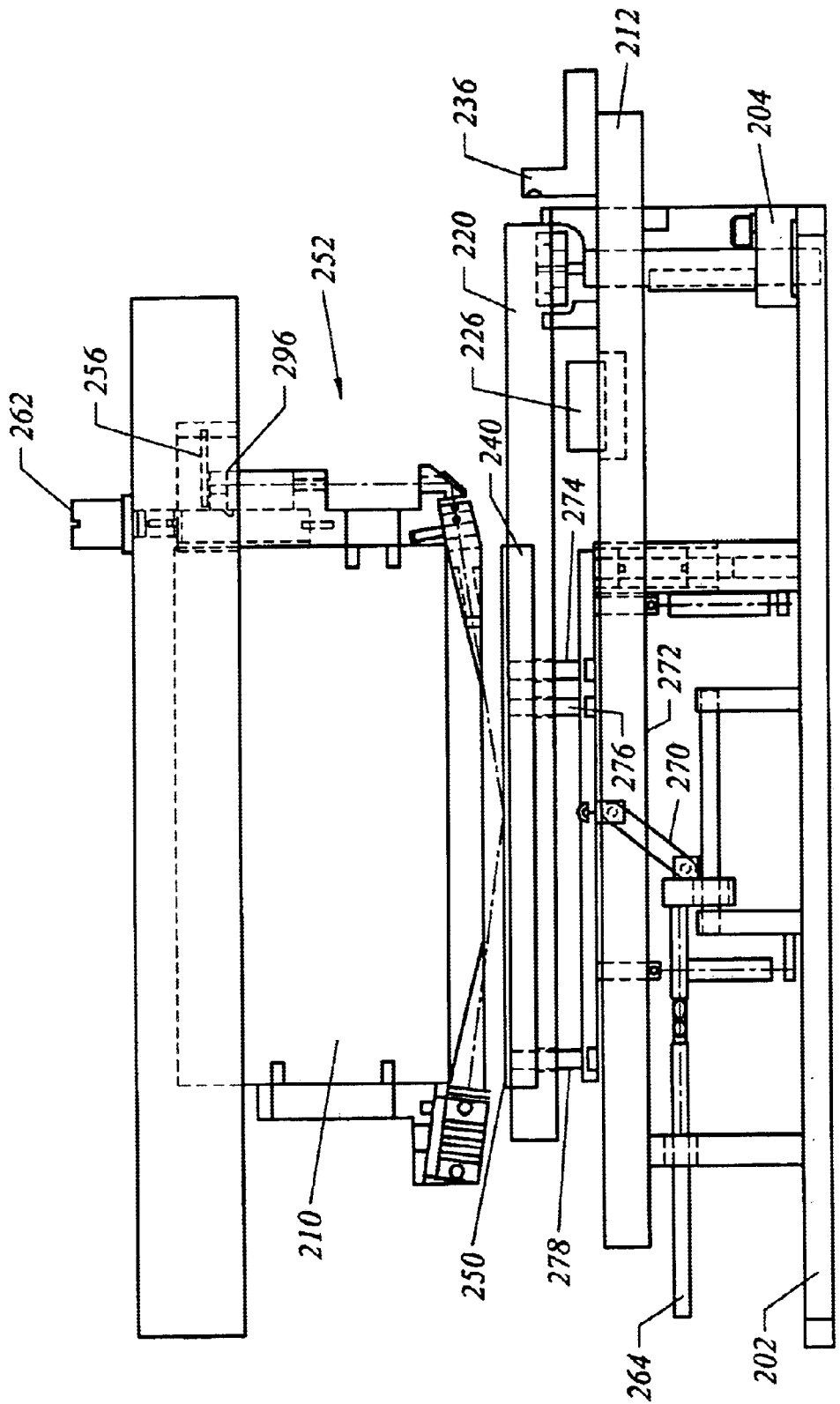
FIG. 4 is an illustration of the side view of the SEM wafer inspection device according to one embodiment of the present invention.

FIG. 4 is a diagram illustrating the front view of the SEM wafer inspection apparatus 200 according to one embodiment of the present invention. As previously described, the Z-stage assembly 201 (platform) is located on a base plate 202. Attached to the upper surface of the base plate 202, actuator column 204, along with actuator columns 206 and 208 (not shown here) support the grounding plate 212. This three point support of the ground plate 212 allows for a kinematical structure that is more stable without overly constraining the grounding plate 212.

As shown herein, the interferometer mirror 236 is situated along one edge of the grounding plate 212, at the same approximate height as the wafer 250, but electrically isolated from the high voltage plate 220.

In one embodiment, a lever 264 is used to sever the wafer 250 from the electrostatic chuck 240 using a linkage mechanism 270–278, after the electrostatic charge has been removed.

The electrostatic chuck 240 is recessed in the high voltage plate 220. The wafer 250 under inspection is placed on the electrostatic chuck 240 and held in place by polar electrostatic charge at the surface of the electrostatic chuck.

The lens 210 of the SEM is positioned above the wafer 250 so as to scan each area of the wafer 250 that is to be inspected. The photoelectric sensor mechanism 252 comprising of a plurality of components is further described in FIG. 5.

Figure 5:
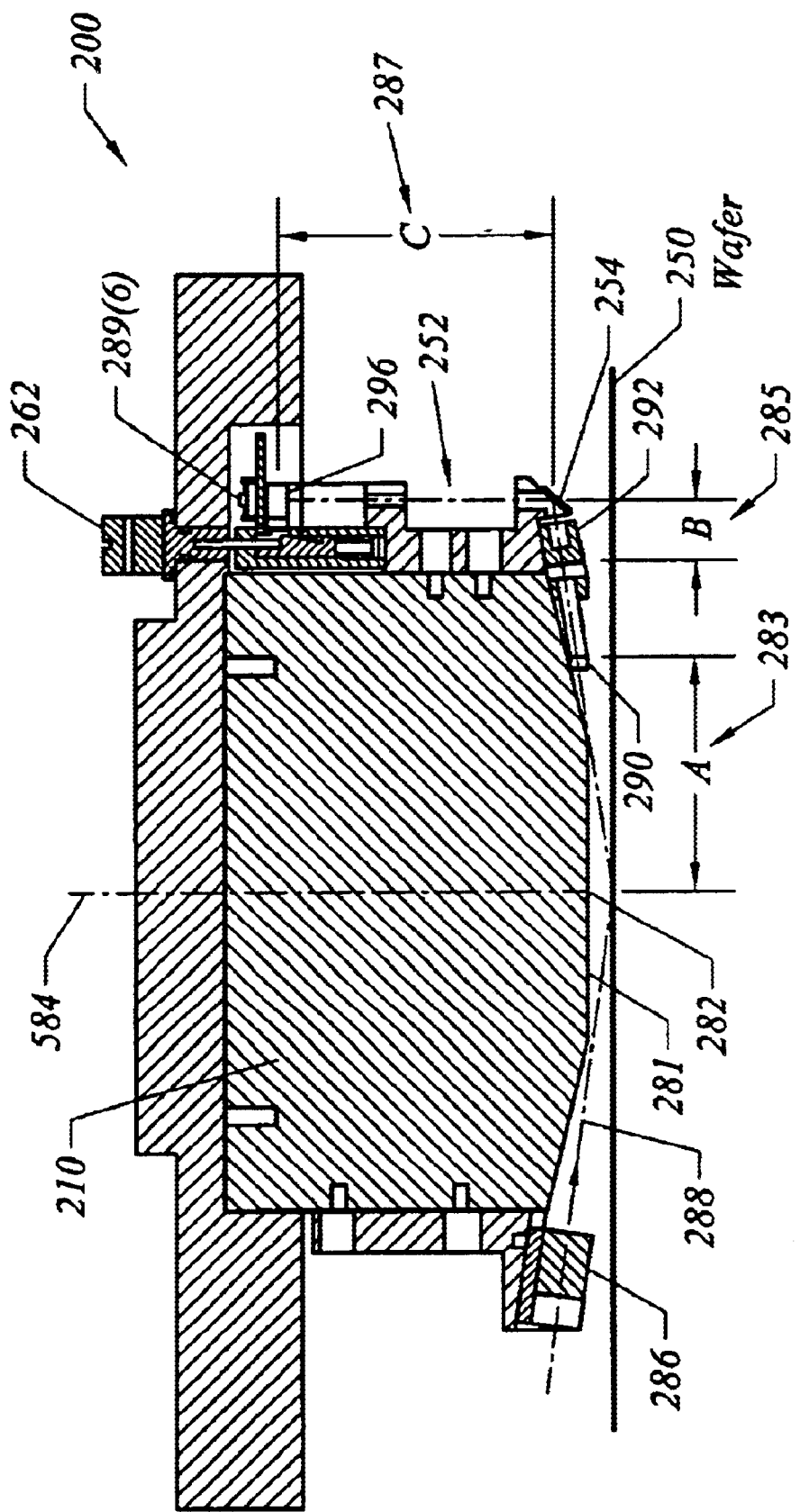
FIG. 5 is a simplified illustration of a side view of a non-contact optical-mechanical sensor system for the Z-stage inspection device according to one embodiment of the present invention.

FIG. 5 is a simplified illustration of a cross-sectional view of a non-contact optical-mechanical sensor system for the Z-stage inspection device according to one embodiment of the present invention.

Bringing a wafer under inspection into focus by adjusting its distance from the SEM lens has at least a couple of advantages over adjusting the focal point of an SEM device. First, adjusting the focal point of an SEM would result in undesirable image rotations. Secondly, the SEM lens design result in an ideal theoretical focal plane at which point, peak performance may be achieved. Therefore, a higher degree of performance may be achieved by bringing the sample under inspection into the ideal focal plane, rather than adjusting the focal point of the SEM.

Looking at a simplified view of the SEM wafer inspection system 200, the SEM lens 210 has a nominal focal point 282 along a particle beam axis 284. In an exemplary embodiment, a laser source 286 may generate a laser beam 288 focus at the anticipated intersection where the particle beam and the surface of the area of the wafer 250 under inspection meets, if the surface area of the wafer is at the lens focal plane. In one embodiment, the laser beam 288 is focused at SEM focal plane with a diameter of half millimeter. The anticipated intersection 287 is located at the focus of a first achromatic lens 290. A second chromatic lens 292 is placed in the path of collimated light passing through the first lens 290. A photoelectric detector is positioned at the focus of the second lens 292 after the collimated light passing through the second lens 292 and reflected off of a mirror 254. Hence, in the present invention, the laser beam 288 is reflected off of the surface of the wafer 250 at the focused of the first lens 290, which operative to generate collimated beam from the reflected laser beam, which in turn is reflected by mirror 254 toward and refocused at a photoelectric detector (sensor) 296. This mechanism is less sensitive to the tilting of the wafer because as long as the upper surface of the wafer area under inspection is positioned at the focal point 282 of the particle beam, i.e., at the focal plane of the SEM beam, the detector 296 will sense that the wafer is located at the focal plane. This detection mechanism is less susceptible to the tilting of the wafer. It is the area of the wafer under inspection that is critical to the inspection process of the present invention. Hence, as long as the surface of the wafer area under inspection is located at the proximity of the focal plane, the inspection process can be commenced, regardless whether or not other areas of the wafer is not at the focal plane. And, leaves more room for error in the expansion or contraction of piezoelectric actuators to be described later.

In one embodiment, the photoelectric detector 296 is a quadrant photo-electric detector (sensor). The operation of the photoelectric sensor assembly 252 is based on the fact that if the particular area of the wafer 250 under inspection is at the nominal focal height in the Z direction, the laser beam 288 would be reflected off of the wafer and onto the center of the photoelectric detector 296. As a result, each half of the photoelectric detector 296 (quadrant photoelectric sensor) would receive a substantially equal intensity of the laser beam 288. However, if the wafer 250 is not at the correct nominal height along the Z-axis, i.e., the surface of the wafer 250 is not at the focal plane, the laser beam 288 would be projected to the photoelectric detector 296 (quadrature photoelectric detector) away from the center. Depending on whether or not the surface of the area 282 of the wafer 250 under inspection is too close or too far from the focal plane of the lens 210 of the SEM, the projection of the laser beam 288 on the photoelectric detector 296 could be more on one side than another.

In an exemplary embodiment of the present invention, the photoelectric sensor assembly 252 and the magnification caused by the two lenses 290 and 292, for any given movement along the Z-axis (vertical direction), the sensor would measure a beam movement in the XY-plane substantially equal to four times the movement along the Z-axis. Although ideally the Z-stage remains parallel to the focal plane of the SEM lens at all times, the non-contact optical sensor system described herein is less sensitive to wafer tilts, and allows for accurate measurement and focusing of the system in cases where the plane of the wafer 250 is not perfectly parallel to the focal plane of the SEM lens.

Furthermore, this arrangement is also less sensitive to defects inherent in wafers such as warping of the wafer 250.

It would be appreciated by one skilled in the art that any combination the sensor geometry presented here is only one example of many possible geometries implementing the inventive concepts of the present invention.

In the present exemplary embodiment, a mirror 254 is a flat mirror placed at a 48.5 degree angle with respect to XY-plane of the wafer 250 under inspection, and reflects the laser beam 288 reflected off of the surface of area 282 of the wafer 250 under inspection toward the photoelectric detector 296.

In one embodiment, the signals generated by the photo detector 296 may be used to control piezoelectric actuators adjusting the height of the Z-stage, until the top surface of the area 282 of the wafer 250 under inspection is at the nominal focal height along the beam axis 284. A plurality of piezoelectric actuators adjust the height of the Z-stage as further described in FIG. 6.

In one embodiment, an adjustment mechanism 262, such as a screw or a knob, allows an operator to manually adjust the physical location of the optical detector in a plane parallel to the plane of the wafer and perpendicular to the beam axis 284. The calibration of the photoelectric detector 296 would result in having the laser beam 288 to be projected in the center of the photoelectric detector 296 when the wafer is at the nominal focal plane of the SEM lens.

Figure 6:
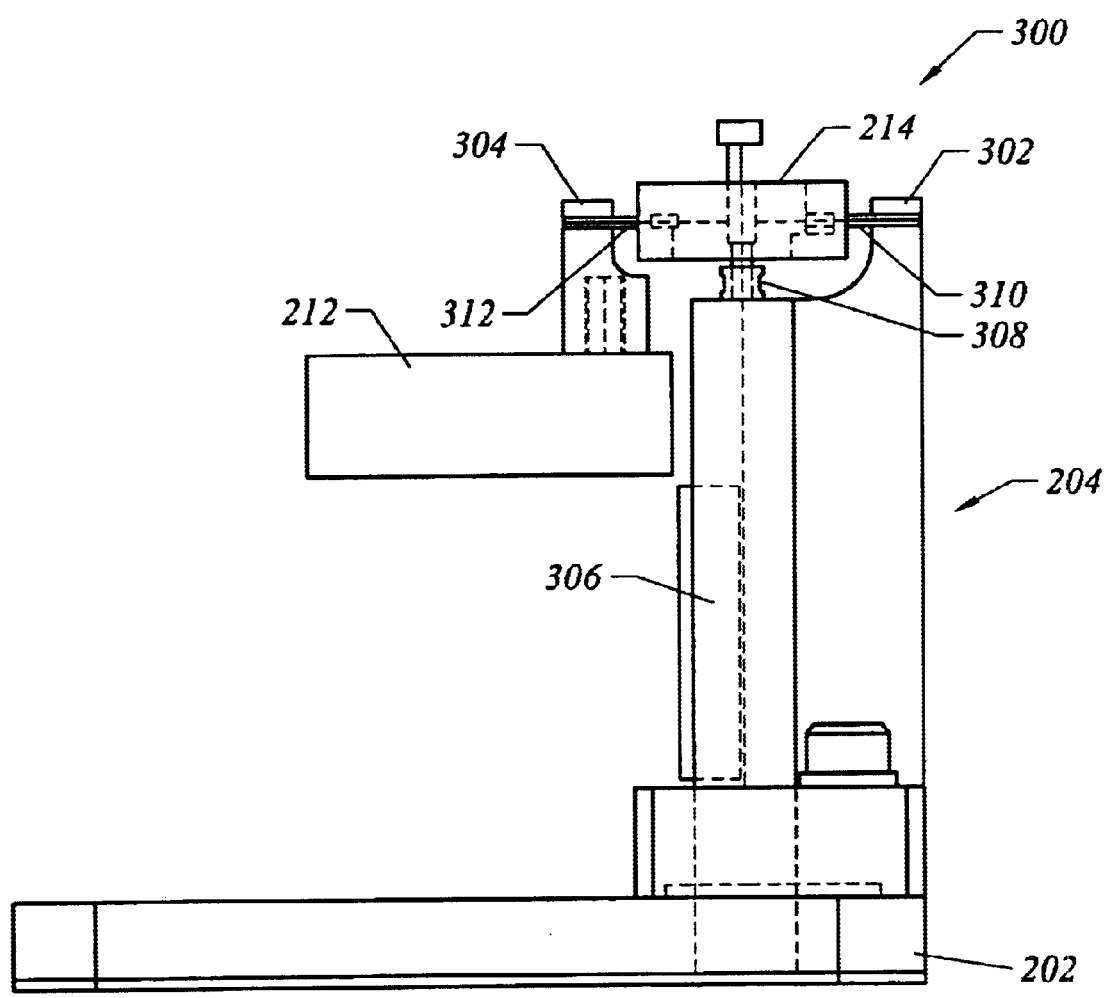
FIG. 6 is an illustration of the Z-stage actuator sub-system according to one embodiment of the present invention.

FIG. 6 is an illustration of the actuator columns 204, 206 and 208 according to one embodiment of the present invention. In one embodiment, a piezo-electric actuators located within each of the actuator columns 204, 206 and 208 receives feedback from the photoelectric detector 296 and simultaneously adjust the height of the Z-stage by moving the grounding plate 212 and the high-voltage plate 220 in the Z-direction, until the correct height is achieved.

In one embodiment, each of the three actuator columns 204, 206 and 208 are attached to the upper surface of the base plate 202. In this example, actuator column 204 is described in detail. The actuator column 204 is situated on the upper surface of the base plate 202 and supports the grounding plate 212 through a flexure mechanism 300. The flexure mechanism 300 attaching the base plate 212 to the actuator column 204. The flexure mechanism 300 includes a first flexure 310 and a second flexure 312, a flexure block 214, a piezoelectric actuator 308 and an actuator column or stack 204 at a contact point 302. The first flexure 310 having two ends, a first end is coupled to the actuator column 204 and a second end coupled to the flexure block 214. The flexure 312 also having two ends, a first end is coupled to the flexure block 214 and a second end coupled to the grounding plate 212 at a contact point 304. The grounding plate 212 is in this way attached to and supported by the flexure block 214 which in turn is supported by the piezoelectric actuator 308. The flexure block 214 is positioned between the first flexure 310 and the second flexure 312, wherein relative position of flexure block 214 is between the first flexure 310 and second flexure 312 is adjustable so that expansion or contraction of piezoelectric actuator can cause magnified movement on the grounding plate 212.

The piezoelectric actuator 308 is a ceramic piezoelectric actuator that increases and decreases its length in response to the electric voltage applied to it. Signals generated by the photoelectric detector 296 control a servo mechanism which in turn generates voltage signals controlling each of the three actuators supporting the grounding plate 212. Ideally, the application of the feedback signal generated by the photoelectric detector 296 results in identical increases or decreases in the length of each piezoelectric actuator and the raising or lowering of the grounding plate and the wafer 250. In practice, the variation in the expansion or contraction of each piezoelectric actuator is small enough to allow near ideal operation.

The feedback signals of the photoelectric detector 296 continue to control the magnitude of the voltage applied to the three piezoelectric actuators (including actuator 308) until the actuators bring the grounding plate and the wafer under inspection within the focal plane of the SEM lens. The relative position of the contact point of the piezoelectric actuator with the flexure block 214 and the location of the ground plate attachment 304 determines the magnification of the movements of the piezoelectric actuators. In one embodiment, the distance G 314 of the piezoelectric actuator 308 from the fixed end 302 is equal to the distance H 316 of the piezoelectric actuator 308 to the grounding plate 304, resulting in a two unit movement of the grounding plate 212 for each one unit elongation of the piezoelectric actuator 308. Alternative embodiments may be used to achieve different ratio between piezoelectric actuator movement and Z-stage movement. Furthermore, in the present invention, the Z-stage movements can reach within 0.25 micron of the SEM focal plane.

The use of this flexure pivot design further reduces the hysteresis and minimizes friction, in translating the movements of the piezoelectric actuators into movements of the grounding plate 212. In one embodiment of the present invention, the flexure is made of BeCu with a thickness of about 0.5 mm. BeCu is non-magnetic, has less hysteresis resulting in no dead zone and creates less friction.

In one embodiment, the three actuator pistons such as actuator piston 308 respond to the feedback signals generated by the photoelectric detector 296, and actuate a movement in the Z-direction simultaneously.

The foregoing examples illustrate certain exemplary embodiments of the invention from which other embodiments, variations, and modifications will be apparent to those skilled in the art. The invention should therefore not be limited to the particular embodiments discussed above, but rather is defined by the following claims.

What is claimed is:

1. A method of positioning a specimen situated in a scanning electron microscope environment for inspecting defects in a plurality of areas of said specimen, the scanning electron microscope providing a particle beam along an axis perpendicular to the specimen, comprising:

moving said specimen in directions perpendicular to said particle beam axis to a first of said plurality of areas;

sensing and moving the specimen toward a focal plane of the particle beam in a direction along the particle beam axis;

suspending moving the specimen when the specimen is positioned within the focal plane proximity and the proximity of said first of said plurality of areas;

scanning and inspecting the first of said plurality of areas for defects;

moving said specimen from the first inspection area to a second of said plurality of areas for inspection;

wherein said sensing and moving the specimen is being conducted via an optical sensing system detecting a top surface of said first of said plurality of areas under inspection relative to the focal plane and operative to generate feedback signals to adjust voltages applied to a plurality of piezoelectric actuators to expand and contract said piezoelectric actuators, wherein specimen position along the particle beam axis;

wherein said plurality of piezoelectric actuators including three actuators providing a stable supporting structure for precision movements and;

wherein each of said plurality of piezoelectric actuators further including a flexure system for supporting said specimen that reducing hysteresis and minimizing friction in translating the expansion and contraction of the piezoelectric actuators.

2. A method of positioning a specimen as recited in claim 1, wherein said specimen is a semiconductor wafer.

3. A method of positioning a specimen as recited in claim 1, wherein moving the specimen is suspended when the specimen is within 0.25 micrometers of the focal plane.

4. A method of positioning a specimen as recited in claim 1, wherein said optical sensing system including:

providing a light beam generated by an optical source, wherein said light beam projecting toward a point where particle beam and a top surface of said area under inspection insects causing said light to reflect off of said top surface;

positioning a first achromatic lens wherein focus of said first lens is located at the projected point of said light beam, said lens operative to generate a collimated light along a path; and positioning a second achromatic lens in the path of said collimated light generated by said first lens, and operative to converge said collimated light to focus at a detector after being reflected off of a mirror, wherein said detector detecting the converged light to determine the position of said first of said plurality of areas relative to the focal plane wherein said specimen need not be perfectly perpendicular to the particle beam axis.

5. A method of positioning a specimen as recited in claim 1, wherein said specimen is coupled to an electrostatic chuck coupled to said plurality of piezoelectric actuators.

6. A method of positioning a specimen as recited in claim 5, wherein said electrostatic chuck is made of ceramic-based non-conductive material for minimizing eddy current generated from moving said specimen.

7. A method of positioning a specimen as recited in claim 5, further comprising an interferometer mirror coupled to said chuck along a first direction perpendicular to the particle beam axis providing a specimen position feedback in accordance with specimen movement along the first direction.

8. A method of positioning a specimen as recited in claim 7, wherein said interferometer minor is coupled to a potential of ground level at a height of approximately the specimen is located.

9. A system of positioning a specimen situated in a scanning electron microscope environment for inspecting defects in a plurality of areas of said specimen, the scanning electron microscope providing a particle beam along an axis perpendicular to the specimen, comprising:

means for moving said specimen in directions perpendicular to said particle beam axis to a first of said plurality of areas;

means for sensing and moving the specimen toward a focal plane of the particle beam in a direction along the particle beam axis;

means for suspending moving the specimen when the specimen is positioned within the focal plane proximity and the proximity of said first of said plurality of areas;

means for scanning and inspecting the first of said plurality of areas for defects;

means for moving said specimen from said first inspection area to a second of said plurality of areas for inspection;

wherein said means for sensing and moving the specimen is being conducted via an optical sensing system detecting a top surface of said first of said plurality of areas under inspection relative to the focal plane and operative to generate feedback signals to adjust voltages applied to a plurality of piezoelectric actuators to expand and contract said piezoelectric actuators, wherein said expansion and contraction of the piezoelectric actuators provide the adjustment of said specimen position along the article beam axis;

wherein said plurality of piezoelectric actuators including three actuators providing a stable structure for precision movements; and wherein each of said plurality of piezoelectric actuators further including a flexure system for supporting said specimen that reducing hysteresis and minimizing friction in translating the expansion and contraction of the piezoelectric actuators.

10. A system of positioning a specimen as recited in claim 9, wherein said specimen is a semiconductor wafer.

11. A system of positioning a specimen as recited in claim 9, wherein said specimen is moved to be within 0.25 micrometers of the focal plane.

12. A system of positioning a specimen as recited in claim 9, wherein said optical sensing system including:

an optical source for generating light beam, wherein said light beam projecting toward a point where particle beam and a top surface of said area under inspection insects causing said light to reflect off of said top surface;

a first achromatic lens wherein focus of said first lens is located at the projected point of said light beam, said lens operative to generate a collimated light along a path; and a second achromatic lens in the path of said collimated light converted by said first lens, and operative to converge said collimated light to focus at a detector after being reflected off of a mirror, wherein said detector detecting the converged light to determine the position of said first of said plurality of areas relative to the focal plane wherein said specimen need nor be perfectly perpendicular to the particle beam axis.

13. A system of positioning a specimen as recited in claim 9, wherein said specimen is coupled to an electrostatic chuck coupled to said plurality of piezoelectric actuators.

14. A system of positioning a specimen as recited in claim 13, wherein said electrostatic chuck is made of non-conductive material for minimizing eddy current generated from moving said specimen.

15. A system of positioning a specimen as recited in claim 13, wherein said non-conductive material is a ceramic-based material.

16. A system of positioning a specimen as recited in claim 13, further comprising an interferometer mirror coupled to said chuck along a first direction perpendicular to the particle beam axis providing a specimen position feedback in accordance with specimen movement along the first direction.

17. A system of positioning a specimen as recited in claim 16, wherein said interferometer mirror is coupled to a potential of ground level at a height of approximately the specimen is located.

18. A method for positioning a specimen as recited in claim 4, wherein the collimated light traversing from the first achromatic lens to the second achromatic lens is free from a reflection off of the specimen.

19. A system for positioning a specimen as recited in claim 12, wherein the collimated light traversing from the first achromatic lens to the second achromatic lens is free from a reflection off of the specimen.

20. A method for inspecting a specimen, the method comprising:

moving a specimen at at least a first speed in at least a first direction perpendicular to a particle beam axis of a scanning electron microscope, the scanning electron microscope configured to provide a particle beam along the particle beam axis;

reducing at least the first speed of the specimen in response to the particle beam axis intersecting the specimen in a first proximity of the first area or within the first area;

moving the specimen at a second speed in a second direction parallel to the particle beam axis;

reducing the second speed of the specimen in response to a focal plane of the particle beam being in a second proximity of the first area;

inspecting the first area of the specimen with the particle beam;

wherein the moving the specimen at a second speed in a second direction include adjusting a first distance from the specimen to a lens associated with the scanning electron microscope;

wherein the moving the specimen at a second speed in a second direction is substantially free from adjusting the focal plane of the particle beam;

wherein the reducing the second speed includes reducing the second speed to substantially zero;

wherein the moving the specimen at a second speed in a second direction includes:
  detecting a second distance from the specimen to the focal plane;
  generating a feedback signal to a plurality of piezoelectric actuators;
  adjusting the plurality of piezoelectric actuators in response to the feedback signal;

wherein the plurality of piezoelectric actuators includes at least three actuators provides a precision adjustment;

wherein each of the plurality of piezoelectric actuators includes a flexure system for supporting the specimen and reducing hysteresis and friction in translating an expansion or contraction of the each of the plurality of piezoelectric actuators.

21. A method for inspecting a specimens the method comprising:

moving a specimen at at least a first speed in at least a first direction perpendicular to a particle beam axis of a scanning electron microscope, the scanning electron microscope configured to provide a particle beam along the particle beam axis;

reducing at least the first speed of the specimen in response to the particle beam axis intersecting the specimen in a first proximity of the first area or within the first area;

moving the specimen at a second speed in a second direction parallel to the particle beam axis;

reducing the second speed of the specimen in response to a focal plane of the particle beam being in a second proximity of the first area;

inspecting the first area of the specimen with the particle beam;

wherein the moving the specimen at a second speed in a second direction includes adjusting a first distance from the specimen to a lens associated with the scanning electron microscope;

wherein the moving the specimen at a second speed in a second direction is substantially free from adjusting the focal plane of the particle beam;

wherein the reducing the second speed includes reducing the second speed to substantially zero;

wherein the moving the specimen at a second speed in a second direction includes:
  detecting a second distance from the specimen to the focal plane;
  generating a feedback signal to a plurality of piezoelectric actuators;
  adjusting the plurality of piezoelectric actuators in response to the feedback signal;

wherein the plurality of piezoelectric actuators includes at least three actuators provides a precision adjustment;

wherein each of the plurality of piezoelectric actuators includes a flexure system for supporting the specimen and reducing hysteresis and friction in translating an expansion or contraction of the each of the plurality of piezoelectric actuators;

wherein the detecting a second distance from the specimen to the focal plane includes:
  reflecting a light beam at a first point associated with a first surface of the first area;
  wherein at the first point, the particle beam and the first surface of the first area insects;
  generating a collimated light beam in response to the reflected light beam;

reflecting the collimated light beam off of a mirror,
focusing the reflected collimated light beam onto a detector;
detecting the focused reflected collimated light beam;
processing information associated with the detected light beam;
determining the second distance from the specimen to and the focal plane based on at least information associated with the detected light beam.

22. The method claim 21 wherein the first surface of the first area is free from being perpendicular to the particle beam axis.

23. A method for inspecting a specimen, the method comprising:

moving a specimen at at least a first speed in at least a first direction perpendicular to a particle beam axis of a scanning electron microscope, the scanning electron microscope configured to provide a particle beam along the particle beam axis;

reducing at least the first speed of the specimen in response to the particle beam axis intersecting the specimen in a first proximity of the first area or within the first area;

moving the specimen at a second speed an a second direction parallel to the particle beam axis;

reducing the second speed of the specimen in response to a focal plane of the particle beam being in a second proximity of the first area;

inspecting the first area of the specimen with the particle beam;

wherein the moving the specimen at a second speed in a second direction includes adjusting a first distance from the specimen to a lens associated with the scanning electron microscope;

wherein the moving the specimen at a second speed in a second direction is substantially free from adjusting the focal plane or the particle beam;

wherein the reducing the second speed includes reducing the second speed to substantially zero;

wherein the moving the specimen at a second speed in a second direction includes:

detecting a second distance from the specimen to the focal plane;

generating a feedback signal to a plurality of piezoelectric actuators;

adjusting the plurality of piezoelectric actuators in response to the feedback signal;

wherein the plurality of piezoelectric actuators includes at least three actuators provides a precision adjustment;

wherein each of the plurality of piezoelectric actuators includes a flexure system for supporting the specimen and reducing hysteresis and friction in translating an expansion or contraction of the each of the plurality of piezoelectric actuators;

wherein the detecting a second distance from the specimen to the focal plane includes:

reflecting a light beam at a first point associated with a first surface of the first area;

wherein at the first point, the particle beam and the first surface of the first area insects;

generating a collimated light beam in response to the reflected light beam;

reflecting the collimated light beam off of a mirror;

focusing the reflected collimated light beam onto a detector;

detecting the focused reflected collimated light;

processing information associated with the detected light beam;

determining the second distance from the specimen and the focal plane based on at least information associated with the detected light beam;

wherein the plurality of piezoelectric actuators are coupled to an electrostatic chuck;

wherein the electrostatic chuck is made of ceramic-based non-conductive material for reducing eddy current generated from moving the specimen;

wherein the electrostatic chuck is coupled to an interferometer mirror along a first direction perpendicular to the particle beam axis;

wherein the interferometer mirror provides a specimen position feedback in response to a specimen movement along the first direction.

* * * * *